(12) United States Patent
Reisiger

(10) Patent No.: US 8,421,536 B2
(45) Date of Patent: Apr. 16, 2013

(54) APPARATUS AND METHODS FOR ELECTRONIC AMPLIFICATION

(75) Inventor: Mark Reisiger, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/239,139

(22) Filed: Sep. 21, 2011

(65) Prior Publication Data

US 2013/0069720 A1   Mar. 21, 2013

(51) Int. Cl.
*H03F 3/45* (2006.01)
(52) U.S. Cl.
USPC .......................................... 330/253; 330/261
(58) Field of Classification Search ........... 330/252–261
See application file for complete search history.

(56) References Cited

U.S. PATENT DOCUMENTS

| | | | |
|---|---|---|---|
| 4,577,228 A * | 3/1986 | Arai et al. | 330/253 |
| 5,248,946 A * | 9/1993 | Murakami et al. | 330/253 |
| 5,389,892 A | 2/1995 | Embree | |
| 6,369,652 B1 * | 4/2002 | Nguyen et al. | 330/253 |
| 6,803,819 B2 * | 10/2004 | Kim | 330/253 |

OTHER PUBLICATIONS

Datasheet for Analog Devices AD8657, *18V, Precision, Micropower CMOS RRIO Operational Amplifier*, Mar. 2011, 24 pages (available at World Wide Web page: analog.com/en/all-operational-amplifiers-op-amps/operational-amplifiers-op-amps/ad8657/products/product.html).

Monticelli, Dennis M. *A Quad CMOS Single-Supply Op Amp with Rail-to-Rail Output Swing*, IEEE Journal of Solid-State Circuits, vol. SC-21, No. 6, Dec. 1986, pp. 1026-1034.

* cited by examiner

*Primary Examiner* — Khanh V Nguyen
(74) *Attorney, Agent, or Firm* — Knobbe Martens Olson & Bear LLP

(57) ABSTRACT

Apparatus and methods for electronic amplification are provided. In one embodiment, a method amplifying a differential input voltage signal using a first NMOS transistor and a second NMOS transistor is provided. The method includes controlling a drain-source voltage of the first NMOS transistor using a first high voltage NMOS transistor and a first high voltage PMOS transistor. The first high voltage NMOS and PMOS transistors are electrically connected in parallel and to a drain of the first NMOS transistor. The method further includes controlling a drain-source voltage of the second NMOS transistor using a second high voltage NMOS transistor and a second high voltage PMOS transistor. The second high voltage NMOS and PMOS transistors are electrically connected in parallel and to a drain of the second NMOS transistor.

29 Claims, 9 Drawing Sheets

APPARATUS AND METHODS FOR ELECTRONIC AMPLIFICATION

BACKGROUND

1. Field

Embodiments of the invention relate to electronic devices, and more particularly, to amplifiers.

2. Description of the Related Technology

An amplifier, such as an operational amplifier, can include one or more amplification stages to achieve the amplifier's overall performance. For example, the amplifier can include amplification stages cascaded to achieve a desired overall gain of the amplifier.

The input stage of the amplifier can have a relatively large impact on the performance of the amplifier. For example, the common-mode input voltage operating range of the amplifier can be determined by the common-mode input voltage operating range of the input stage. Additionally, the linearity of the input stage can be important, as a signal generated using the input stage can be amplified by subsequent gain stages.

There is a need for amplifiers having improved performance. Additionally, there is need for amplification stages having improved linearity and that can operate over a wide range of input voltages.

SUMMARY

In one embodiment, an apparatus includes a first amplification stage having a first input, a second input, a first output and a second output. The first amplification stage includes a first transistor of a first polarity, the first transistor including an input electrically connected to the first input. The first amplification stage further includes a second transistor of the first polarity, the second transistor including an input electrically connected to the second input. The first and second transistors are configured to operate as a differential pair. The first amplification stage further includes a third transistor of the first polarity, the third transistor including a channel disposed in a signal path between an output of the first transistor and the second output. The first amplification stage further includes a fourth transistor of a second polarity opposite the first polarity, the fourth transistor including a channel electrically connected in parallel with the channel of the third transistor and disposed in a signal path between the output of the first transistor and the second output. The first amplification stage further includes a fifth transistor of the first polarity, the fifth transistor including a channel disposed in a signal path between an output of the second transistor and the first output. The first amplification stage further includes a sixth transistor of the second polarity, the sixth transistor including a channel electrically connected in parallel with the channel of the fifth transistor and disposed in a signal path between the output of the second transistor and the first output.

In another embodiment, a method of electronic amplification is provided. The method includes amplifying a differential input voltage signal using a first transistor and a second transistor, the first and second transistors each of a first type. The method further includes regulating a drain-to-source voltage of the first transistor using a third transistor and a fourth transistor. The third transistor is of the first polarity and the fourth transistor is of a second polarity opposite the first polarity. The third transistor includes a channel disposed in a signal path between a drain of the first transistor and a power supply voltage node. The fourth transistor includes a channel electrically connected in parallel with the channel of the third transistor and disposed in the electrical path between the drain of the first transistor and the power supply voltage node. The method further includes regulating a drain-to-source voltage of the second transistor using a fifth transistor and a sixth transistor. The fifth transistor is of the first polarity and the sixth transistor is of the second polarity. The fifth transistor includes a channel disposed in an electrical path between a drain of the second transistor and the power supply voltage node. The sixth transistor includes a channel electrically connected in parallel with the channel of the fifth transistor and disposed in the signal path between the drain of the second transistor and the power supply voltage node.

In another embodiment, an apparatus includes a first amplification stage having a first input, a second input, a first output and a second output. The first amplification stage includes a first transistor of a first polarity, the first transistor including an input electrically connected to the first input. The first amplification stage further includes a second transistor of the first polarity, the second transistor including an input electrically connected to the second input. The first and second transistors are configured to operate as a differential pair. The first amplification stage further includes a third transistor of the first polarity, the third transistor including a channel disposed in a signal path between an output of the first transistor and the second output. The first amplification stage further includes a fourth transistor of a second polarity opposite the first polarity, the fourth transistor including a channel electrically connected in parallel with the channel of the third transistor and disposed in a signal path between the output of the first transistor and the second output. The first amplification stage further includes a fifth transistor of the first polarity, the fifth transistor including a channel disposed in a signal path between an output of the second transistor and the first output. The first amplification stage further includes a sixth transistor of the second polarity, the sixth transistor including a channel electrically connected in parallel with the channel of the fifth transistor and disposed in a signal path between the output of the second transistor and the first output. The first amplification stage further includes a means for controlling a gate voltage of each of the third, fourth, fifth and sixth transistors.

DETAILED DESCRIPTION OF EMBODIMENTS

Figure 1A:
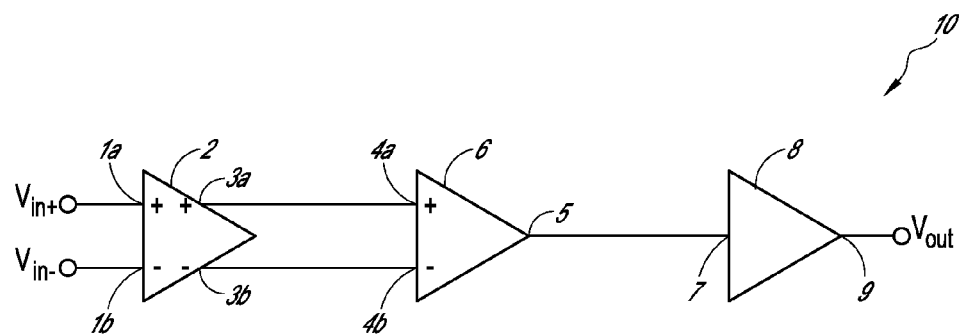
FIG. 1A is a schematic block diagram of one example of an amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Examples of Amplifiers

FIG. 1A is a schematic block diagram of one example of an amplifier 10. The amplifier 10 includes a first amplification stage 2, a second amplification stage 6, and a third amplification stage 8. The amplifier 10 can be used, for example, as an operational amplifier.

The amplifier 10 includes a positive or non-inverted voltage input $V_{in+}$, a negative or inverted voltage input $V_{in-}$, and a voltage output $V_{out}$. The first amplification stage 2 includes a non-inverted input 1a, an inverted input 1b, a non-inverted output 3a, and an inverted output 3b. The second amplification stage 6 includes a non-inverted input 4a, an inverted input 4b, and an output 5. The third amplification stage 8 includes an input 7 and an output 9.

The non-inverted and inverted inputs 1a, 1b of the first amplification stage 2 are electrically connected to the non-inverted and inverted voltage inputs $V_{in+}$, $V_{in-}$ of the amplifier 10, respectively. The non-inverted and inverted outputs 3a, 3b of the first amplification stage 2 are electrically connected to the non-inverted and inverted inputs 4a, 4b of the second amplification stage 6, respectively. The output 5 of the second amplification stage 6 is electrically connected to the input 7 of the third amplification stage 8, and the output 9 of the third amplification stage 8 is electrically connected to the voltage output $V_{out}$ of the amplifier 10.

The amplifier 10 can be used to amplify a differential input voltage signal received on the non-inverted and inverted voltage inputs $V_{in+}$, $V_{in-}$ to generate an amplified output voltage signal on the voltage output $V_{out}$. For example, the first amplification stage 2 can be used to amplify a difference between the non-inverted and inverted voltage inputs $V_{in+}$, $V_{in-}$ to generate an amplified voltage signal between the non-inverted and inverted outputs 3a, 3b of the first amplification stage 2, which can be further amplified by the second amplification stage 6 and the third amplification stage 8 to generate the amplified output voltage signal on the voltage output $V_{out}$.

By using a plurality of amplification stages, such as the first, second and third amplification stages 2, 6, 8, a desired overall gain for the amplifier 10 can be achieved. For example, in some configurations, the amplifier 10 can have a gain equal to about the product of the gain of the first amplification stage 2, the gain of the second amplification stage 6, and the gain of the third amplification stage 8. Accordingly, amplification stages can be cascaded to obtain a desired overall gain of the amplifier 10. Additionally, using a plurality of amplification stages in the amplifier 10 can aid in increasing the input impedance and/or reducing the output impedance of the amplifier 10 relative to an amplifier using a single stage.

Although the amplifier 10 of FIG. 1A includes three stages, the amplifier 10 can be adapted to include more or fewer stages, including stages of the same and/or of a different type. Additionally, although the open-loop gain of the amplifier 10 is typically greater than 1, each of the amplification stages need not have a gain greater than 1. For example, in some implementations, the third amplification stage 8 can be a low gain buffer stage configured to boost the output impedance of the amplifier 10.

The first or input amplification stage 2 can have a relatively large impact on the performance of the amplifier 10. For example, since the non-inverted and inverted voltage inputs $V_{in+}$, $V_{in-}$ are electrically connected to the non-inverted and inverted inputs 1a, 1b of the first amplification stage 2, respectively, the common-mode input voltage operating range of the amplifier 10 can be impacted by the common-mode input voltage operating range of the first amplification stage 2. Additionally, the linearity of the first amplification stage 2 can have a relatively large impact on the overall performance of the amplifier 10. For example, non-linear signal components generated using the first amplification stage 2 can be further amplified by the second amplification stage 6 and/or by the third amplification stage 8.

In some implementations described herein, an amplification stage is provided that has a relatively large common-mode input voltage operating range, a relatively high linearity, and a relatively small circuit layout. The amplification stage can be included in an amplifier, such as the amplifier 10, to improve the overall performance of the amplifier. For example the amplification stage can be used as an input amplification stage in the amplifier so as to improve the common-mode input voltage operating range of the amplifier.

Figure 1B:
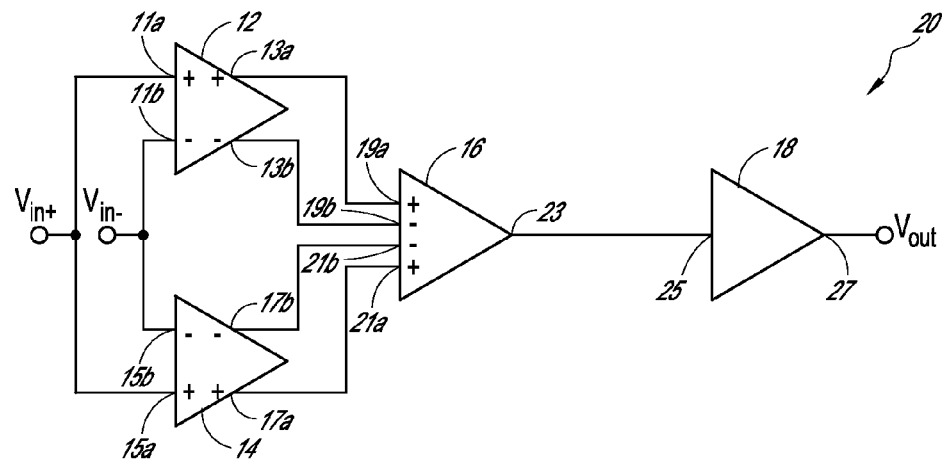
FIG. 1B is a schematic block diagram of another example of an amplifier.

FIG. 1B is a schematic block diagram of another example of an amplifier 20. The amplifier 20 includes a first amplification stage 12, a second amplification stage 14, a third amplification stage 16, and a fourth amplification stage or output stage 18. The amplifier 20 can be used, for example, as an operational amplifier.

The amplifier 20 includes a non-inverted voltage input $V_{in+}$, an inverted voltage input $V_{in-}$, and a voltage output $V_{out}$. The first amplification stage 12 includes a non-inverted input 11a, an inverted input 11b, a non-inverted output 13a, and an inverted output 13b. The second amplification stage 14 includes a non-inverted input 15a, an inverted input 15b, a non-inverted output 17a, and an inverted output 17b. The third amplification stage 16 includes a first non-inverted input 19a, a first inverted input 19b, a second non-inverted input 21a, a second inverted input 21b, and an output 23. The fourth amplification stage 18 includes an input 25 and an output 27.

The non-inverted and inverted inputs 11a, 11b of the first amplification stage 12 are electrically connected to the non-inverted and inverted voltage inputs $V_{in+}$, $V_{in-}$ of the amplifier 20, respectively. Additionally, the non-inverted and inverted inputs 15a, 15b of the second amplification stage 14 are electrically connected to the non-inverted and inverted voltage inputs $V_{in+}$, $V_{in-}$ of the amplifier 20, respectively. The non-inverted and inverted outputs 13a, 13b of the first amplification stage 12 are electrically connected to the first non-inverted input 19a and first inverted input 19b, respectively, of the third amplification stage 16. The non-inverted and inverted outputs 17a, 17b of the second amplification stage 14 are electrically connected to the second non-inverted input 21a and the second inverted input 21b, respectively, of the third amplification stage 16. The output 23 of the third amplification stage 16 is electrically connected to the input 25 of the fourth amplification stage 18, and the output 27 of the fourth amplification stage 18 is electrically connected to the voltage output $V_{out}$ of the amplifier 20.

The amplifier 20 can be used to amplify a differential input voltage signal received on the non-inverted and inverted voltage inputs $V_{in+}$, $V_{in-}$ to generate an amplified output signal on the voltage output $V_{out}$. For example, the first amplification stage 12 can be used to amplify the difference between the non-inverted and inverted voltage inputs $V_{in+}$, $V_{in-}$ to generate a first amplified differential voltage signal on the non-inverted and inverted outputs 13a, 13b. Additionally, the second amplification stage 14 can be used to amplify a difference between the non-inverted and inverted voltage inputs $V_{in+}$, $V_{in-}$ to generate a second amplified differential voltage signal on the non-inverted and inverted outputs 17a, 17b. The first amplified differential voltage signal and the second amplified differential voltage signal can be combined and amplified using the third amplification stage 16 and the fourth amplification stage 18.

In contrast to the amplifier 10 of FIG. 1A, the amplifier 20 of FIG. 1B includes a plurality of input amplification stages electrically connected in parallel. For example, the first and second amplification stages 12, 14 each are electrically connected to the non-inverted and inverted voltage inputs $V_{in+}$, $V_{in-}$ and serve as input stages for the amplifier 20. By using a plurality of input amplification stages in the amplifier 20, the overall input voltage operating range of the amplifier 20 can be improved. For example, the first amplification stage 12 can be configured to amplify the difference between the non-inverted and inverted voltage inputs $V_{in+}$, $V_{in-}$ when the common-mode input voltage is relatively high, and the second amplification stage 14 can be configured to amplify the difference between the non-inverted and inverted voltage inputs $V_{in+}$, $V_{in-}$ when the common-mode input voltage is relatively low. Accordingly, in some implementations, a plurality of input amplification stages can be used to amplify a differential input voltage over different ranges of common-mode input voltage, and each of the input amplification stages are configured to operate over a portion of the common-mode input voltage range so as to improve the performance of the amplifier.

Although various amplification stages have been described in the context of the amplifier 10 of FIG. 1A and the amplifier 20 of FIG. 1B, the amplification stages described herein can be used in wide array of ICs and other electronics configured to amplify electronic signals, including, for example, amplifiers having different circuit topologies.

Overview of Amplification Stages

Apparatus and methods for electronic amplification are disclosed herein. In certain implementations, an amplification stage includes a first input metal oxide semiconductor (MOS) transistor and a second input MOS transistor configured to amplify a differential input voltage signal to generate a differential output voltage signal. The gates of the first and second input MOS transistors can be configured to receive the differential input voltage signal and the drains of the MOS transistors can be configured to generate the differential output voltage signal. The first and second input MOS transistors can be low voltage transistors so as to improve the gain, linearity, and/or other performance characteristics of the amplification stage for a given amount of circuit area. To aid in protecting the first and second input MOS transistors from breakdown over a wide range of common-mode input voltage levels, the first and second input MOS transistors can each include a high voltage PMOS transistor and a high voltage NMOS transistor disposed in a signal path between the drain of the MOS transistor and an output of the amplification stage.

For example, in some implementations, a first high voltage NMOS transistor and a first high voltage PMOS transistor can be electrically connected in parallel and configured such that the channels of the first high voltage NMOS and PMOS transistors are disposed in a signal path between the drain of the first input MOS transistor and a first output of the amplification stage. Similarly, a second high voltage NMOS transistor and a second high voltage PMOS transistor can be electrically connected in parallel and configured such that the channels of the second high voltage NMOS and PMOS transistors are disposed in a signal path between the drain of the second input MOS transistor and a second output of the amplification stage. By configuring the amplification stage in this manner, the high voltage NMOS and PMOS transistors can protect the low voltage input MOS transistors from drain-source breakdown. In certain implementations, the high voltage NMOS transistors and the high voltage PMOS transistors can be configured to conduct the bias current for the input MOS transistors for different common-mode input voltage levels, thereby helping to prevent the high voltage transistors from impacting the common-mode input voltage operating range of the amplification stage. Although configurations using MOS transistors have been described, above, the teachings herein are applicable to other transistor structures, as will be described in detail further below.

Figure 2A:
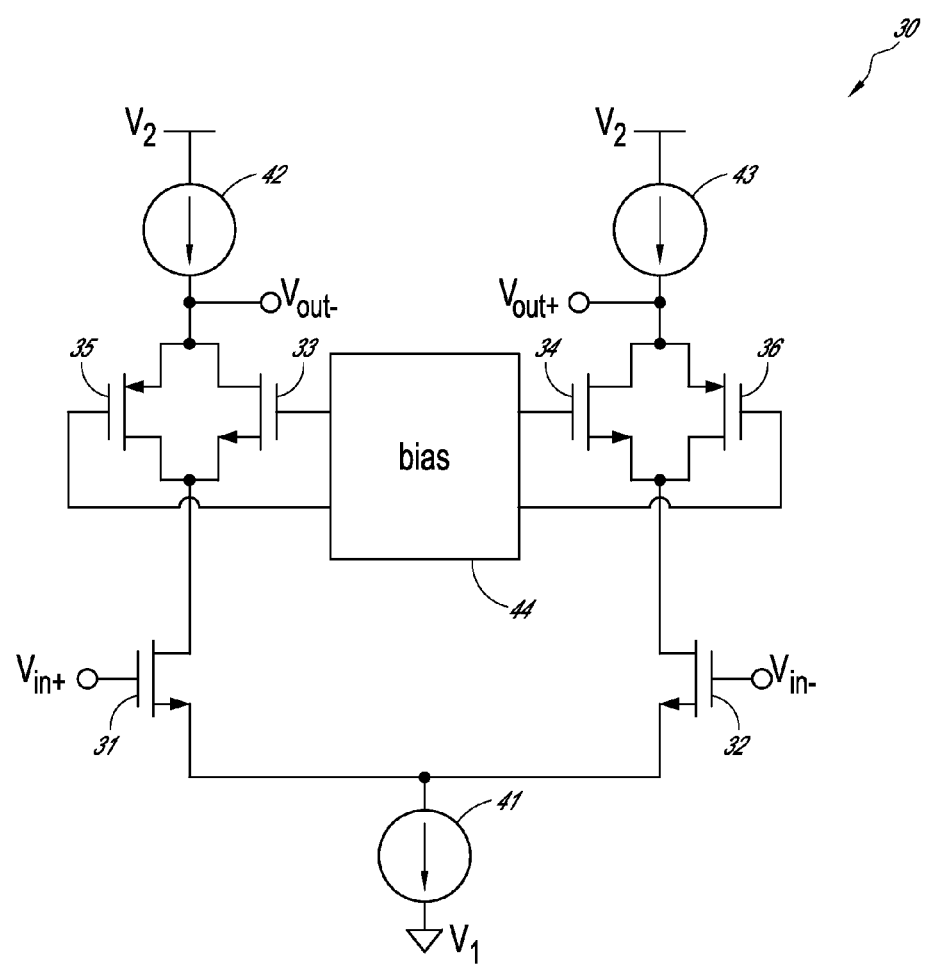
FIG. 2A is a circuit diagram of an amplification stage according to one embodiment.

FIG. 2A is a circuit diagram of an amplification stage 30 according to one embodiment. The amplification stage 30 includes a first input NMOS transistor 31, a second input NMOS transistor 32, a first high voltage NMOS transistor 33, a second high voltage NMOS transistor 34, a first high voltage PMOS transistor 35, a second high voltage PMOS transistor 36, a first current source 41, a second current source 42, a third current source 43, and a bias control block 44. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The amplification stage 30 includes a first or non-inverted voltage input $V_{in+}$, a second or inverted voltage input $V_{in-}$, a first or non-inverted voltage output $V_{out+}$ and a second or inverted voltage output $V_{out-}$. The amplification stage 30 can receive a differential input voltage signal between the non-inverted and inverted voltage inputs $V_{in+}$, $V_{in-}$ and can amplify the differential input voltage signal to generate a differential output voltage signal between the non-inverted and inverted voltage outputs $V_{out+}$, $V_{out-}$.

The first input NMOS transistor 31 includes a gate electrically connected to the non-inverted voltage input $V_{in+}$ and a source electrically connected to a source of the second input NMOS transistor 32 and to a first end of the first current source 41. The first current source 41 further includes a second end electrically connected to a first supply voltage $V_1$, which can be, for example, a ground supply or negative supply voltage. The first input NMOS transistor 31 further includes a drain electrically connected to a source of the first high voltage NMOS transistor 33 and to a drain of the first high voltage PMOS transistor 35. The first high voltage NMOS transistor 33 further includes a drain electrically connected to a source of the first high voltage PMOS transistor 35 and to a first end of the second current source 42 at the inverted voltage output $V_{out-}$ of the amplification stage 30. The second current source 42 further includes a second end electrically connected to a second supply voltage $V_2$, which can be, for example, a positive supply voltage. The first high voltage NMOS transistor 33 and the first high voltage PMOS transistor 35 each include a channel disposed between the source and drain. As shown in FIG. 2A, the channels of the first high voltage NMOS transistor 33 and the first high voltage PMOS transistor 35 have been electrically connected in parallel.

The second input NMOS transistor 32 further includes a gate electrically connected to the inverted voltage input $V_{in-}$. The second input NMOS transistor 32 further includes a drain electrically connected to a source of the second high voltage NMOS transistor 34 and to a drain of the second high voltage PMOS transistor 36. The second high voltage NMOS transistor 34 further includes a drain electrically connected to a source of the second high voltage PMOS transistor 36 and to a first end of the third current source 43 at the non-inverted voltage output $V_{out-}$ of the amplification stage 30. The third current source 43 further includes a second end electrically connected to the second supply voltage $V_2$. The bias control block 44 includes a first output electrically connected to a gate of the first high voltage NMOS transistor 33, a second output electrically connected to a gate of the first high voltage PMOS transistor 35, a third output electrically connected to a gate of the second high voltage NMOS transistor 34, and a fourth output electrically connected to a gate of the second high voltage PMOS transistor 36. The second high voltage NMOS transistor 34 and the second high voltage PMOS transistor 36 each include a channel disposed between the source and drain. As shown in FIG. 2A, the channels of the second high voltage NMOS transistor 34 and the second high voltage PMOS transistor 36 have been electrically connected in parallel. In the illustrated configuration, the gates of the first and second input NMOS transistors 31, 32 operate as transistor inputs and the drains of the first and second input NMOS transistors 31, 32 operate as transistor outputs.

The first and second input NMOS transistors 31, 32 can be used to amplify a differential input voltage signal received between the non-inverted and inverted voltage inputs $V_{in+}$, $V_{in-}$. In certain implementations, the first and second input NMOS transistors 31, 32 are low voltage transistors that have a relatively low breakdown voltage. For example, the source-drain breakdown voltage of the first and second input NMOS transistors 31, 32 can be relatively small, such as a source-drain breakdown voltage that is less than a difference between the second supply voltage $V_2$ and the first supply voltage $V_1$.

The high voltage transistors 33-36 can aid in protecting the first and second input NMOS transistors 31, 32 from breakdown. For example, the voltage drop across the high voltage transistors 33-36 can reduce the drain-source voltage across the first and second input NMOS transistors 31, 32 relative to a configuration in which the high voltage transistors 33-36 are omitted.

Additionally, including the high voltage transistors 33-36 in the amplification stage 30 need not reduce the input voltage operating range of the amplification block 30. For example, as will be described in detail further below, the bias control block 44 can be configured to bias the gates of the high voltage transistors 33-36 so that the biasing of the first and second input NMOS transistors 31, 32 is not hindered by the high voltage transistors 33-36 over the common-mode input voltage operating range of the amplification stage 30. For instance, in some implementations, the first and second high voltage NMOS transistors 33, 34 conduct a relatively large portion of the drain-source bias currents of the first and second input NMOS transistors 31, 32 when the common-mode voltage of the non-inverted and inverted inputs $V_{in+}$, $V_{in-}$ is relatively low, and the first and second high voltage PMOS transistors 35, 36 conduct a relatively large portion of the drain-source bias currents of the first and second input NMOS transistors 31, 32 when the common-mode voltage of the non-inverted and inverted inputs $V_{in+}$, $V_{in-}$ is relatively high. Although, FIG. 2A illustrates a configuration in which the transistors 33-36 are high voltage MOS transistors, in other embodiments, other suitable field-effect transistors (FETs) can serve as the transistors 33-36.

Figure 2B:
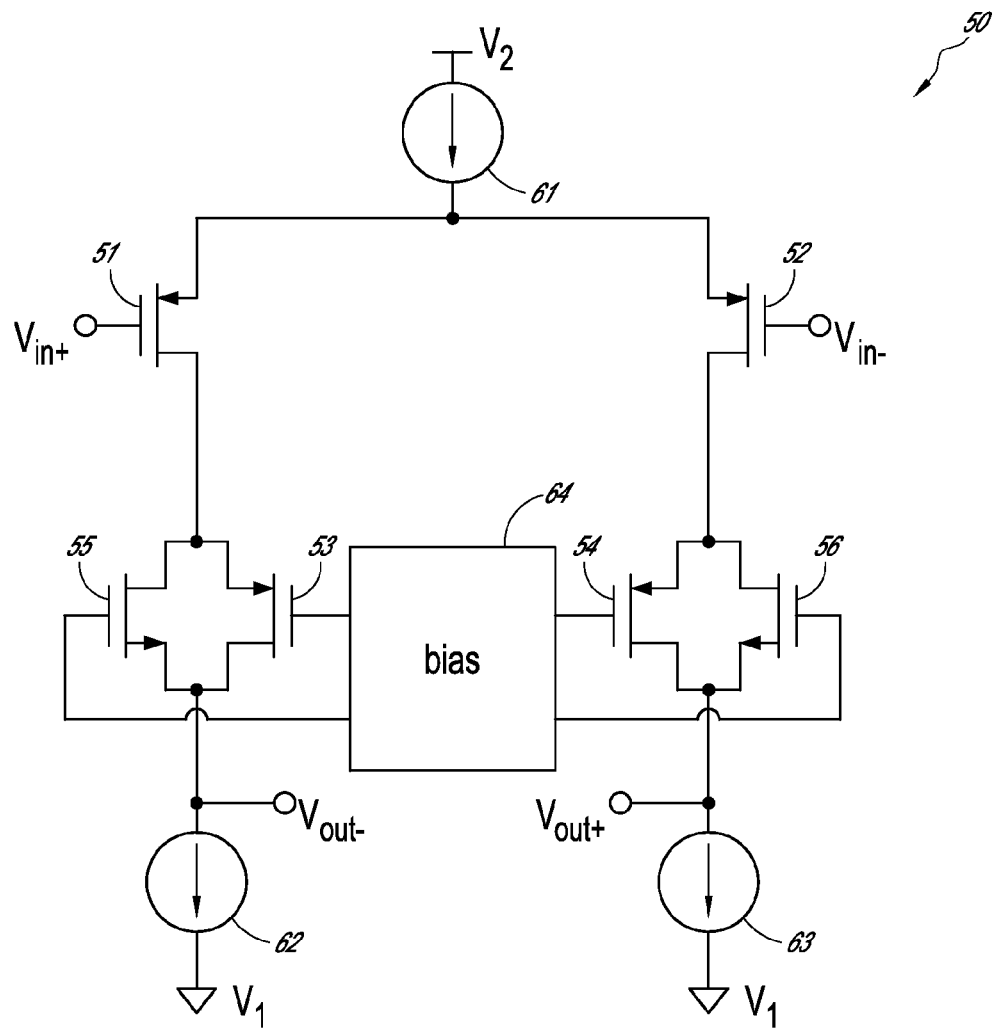
FIG. 2B is a circuit diagram of an amplification stage according to another embodiment.

FIG. 2B is a circuit diagram of an amplification stage 50 according to another embodiment. The amplification stage 50 includes a first input PMOS transistor 51, a second input PMOS transistor 52, a first high voltage PMOS transistor 53, a second high voltage PMOS transistor 54, a first high voltage NMOS transistor 55, a second high voltage NMOS transistor 56, a first current source 61, a second current source 62, a third current source 63, and a bias control block 64.

The amplification stage 50 includes a first or non-inverted voltage input $V_{in+}$, a second or inverted voltage input $V_{in-}$, a first or non-inverted voltage output $V_{out+}$ and a second or inverted voltage output $V_{out-}$. The amplification stage 50 can receive a differential input voltage signal between the non-inverted and inverted voltage inputs $V_{in+}$, $V_{in-}$ and can amplify the differential input voltage signal to generate a differential output voltage signal between the non-inverted and inverted voltage outputs $V_{out+}$, $V_{out-}$.

The first input PMOS transistor 51 includes a gate electrically connected to the non-inverted voltage input $V_{in+}$ and a source electrically connected to a source of the second input PMOS transistor 52 and to a first end of the first current source 61. The first current source 61 further includes a second end electrically connected to the second supply voltage $V_2$. The first input PMOS transistor 51 further includes a drain electrically connected to a source of the first high voltage PMOS transistor 53 and to a drain of the first high voltage NMOS transistor 55. The first high voltage PMOS transistor 53 further includes a drain electrically connected to a source of the first high voltage NMOS transistor 55 and to a first end of the second current source 62 at the inverted voltage output $V_{out-}$ of the amplification stage 50. The second current source 62 further includes a second end electrically connected to the first supply voltage $V_1$. The first high voltage PMOS transistor 53 and the first high voltage NMOS transistor 55 each include a channel disposed between the source and drain. As shown in FIG. 2B, the channels of the first high voltage PMOS transistor 53 and the first high voltage NMOS transistor 55 have been electrically connected in parallel.

The second input PMOS transistor 52 includes a gate electrically connected to the inverted voltage input $V_{in-}$. The second input PMOS transistor 52 further includes a drain electrically connected to a source of the second high voltage PMOS transistor 54 and to a drain of the second high voltage NMOS transistor 56. The second high voltage PMOS transistor 54 further includes a drain electrically connected to a source of the second high voltage NMOS transistor 56 and to a first end of the third current source 63 at the non-inverted voltage output $V_{out-}$ of the amplification stage 50. The third current source 63 further includes a second end electrically connected to the first supply voltage $V_1$. The bias control block 64 includes a first output electrically connected to a gate of the first high voltage PMOS transistor 53, a second output electrically connected to a gate of the first high voltage NMOS transistor 55, a third output electrically connected to a gate of the second high voltage PMOS transistor 54, and a fourth output electrically connected to a gate of the second high voltage NMOS transistor 56. The second high voltage PMOS transistor 54 and the second high voltage NMOS transistor 56 each include a channel disposed between the source and drain. As shown in FIG. 2B, the channels of the second high voltage PMOS transistor 54 and the second high voltage NMOS transistor 56 have been electrically connected in parallel. In the illustrated configuration, the gates of the first and second input PMOS transistors 51, 52 operate as transistor inputs and the drains of the first and second input PMOS transistors 51, 52 operate as transistor outputs.

In certain implementations, the first and second input PMOS transistors 51, 52 are low voltage transistors that have a relatively low breakdown voltage. For example, the source-drain breakdown voltage of the first and second input PMOS transistors 51, 52 can be relatively small, such as a source-drain breakdown voltage that is less than a difference between the second supply voltage $V_2$ and the first supply voltage $V_1$.

The high voltage transistors 53-56 can aid in protecting the first and second input PMOS transistors 51, 52 from breakdown. For example, the voltage drop across the high voltage transistors 53-56 can reduce the drain-source voltage across the first and second input PMOS transistors 51, 52 relative to a configuration in which the high voltage transistors 53-56 are omitted.

Additionally, the inclusion of the high voltage transistors 53-56 in the amplification stage 50 need not reduce the input voltage operating range of the amplification block 50. For example, as will be described in further detail below, the bias control block 64 can be configured to bias the gates of the high voltage transistors 53-56 so that the biasing of the first and second input PMOS transistors 51, 52 is not hindered by the high voltage transistors 53-56 over the common-mode input voltage operating range of the amplification stage 50. For instance, in some implementations, the first and second high voltage PMOS transistors 53, 54 conduct a relatively large portion of the drain-source bias currents of the first and second input PMOS transistors 51, 52 when the common-mode voltage of the non-inverted and inverted inputs $V_{in+}$, $V_{in-}$ is relatively high, and the first and second high voltage NMOS transistors 55, 56 conduct a relatively large portion of the drain-source bias currents of the first and second input PMOS transistors 51, 52 when the common-mode voltage of the non-inverted and inverted inputs $V_{in+}$, $V_{in-}$ is relatively low. Although, FIG. 2B illustrates a configuration in which the transistors 53-56 are high voltage MOS transistors, in other embodiments, other suitable field-effect transistors (FETs) can serve as the transistors 53-56.

Figure 3A:
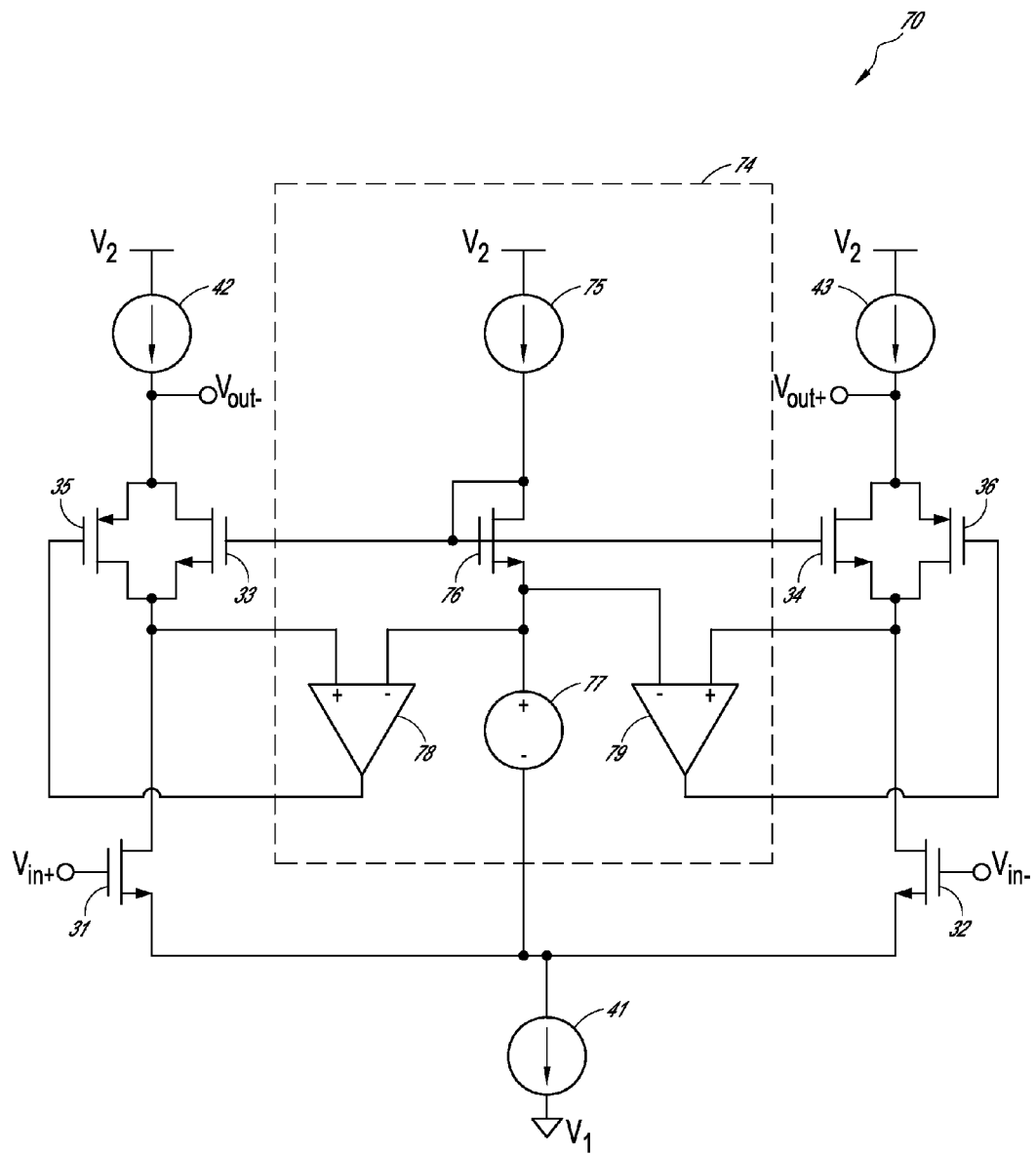
FIG. 3A is a circuit diagram of an amplification stage according to yet another embodiment.

FIG. 3A is a circuit diagram of an amplification stage 70 according to yet another embodiment. The amplification stage 70 includes the first input NMOS transistor 31, the second input NMOS transistor 32, the first high voltage NMOS transistor 33, the second high voltage NMOS transistor 34, the first high voltage PMOS transistor 35, the second high voltage PMOS transistor 36, the first current source 41, the second current source 42, the third current source 43, and a bias control block 74.

The amplification stage 70 further includes a first or non-inverted voltage input $V_{in+}$, a second or inverted voltage input $V_{in-}$, a first or non-inverted voltage output $V_{out+}$ and a second or inverted voltage output $V_{out-}$. The amplification stage 70 can receive a differential input voltage signal between the non-inverted and inverted voltage inputs $V_{in+}$, $V_{in-}$ and can amplify the differential input voltage signal to generate a differential output voltage signal between the non-inverted and inverted voltage outputs $V_{out+}$, $V_{out-}$.

The amplification stage 70 is electrically connected in the configuration described earlier with reference to FIG. 2A. The bias control block 74 of FIG. 3A illustrates one implementation of the bias control block 44 of FIG. 2A. However, other implementations of the bias control block 44 are possible.

The bias control block 74 includes a current source 75, an NMOS transistor 76, a voltage source 77, a first amplification block 78, and a second amplification block 79. The current source 75 includes a first end electrically connected to the second supply voltage $V_2$ and a second end electrically connected to a drain and gate of the NMOS transistor 76 and to the gates of the first and second high voltage NMOS transistors 33, 34. The NMOS transistor 76 further includes a source electrically connected to an inverted input of the first amplification block 78, to an inverted input of the second amplification block 79, and to a positive terminal of the voltage source 77. The first amplification block 78 further includes an output electrically connected to a gate of the first high voltage PMOS transistor 35 and a non-inverted input electrically connected to a drain of the first input NMOS transistor 31, to a source of the first high voltage NMOS transistor 33, and to a drain of the first high voltage PMOS transistor 35. The second amplification block 79 further includes an output electrically connected to a gate of the second high voltage PMOS transistor 36 and a non-inverted input electrically connected to a drain of the second input NMOS transistor 32, to a source of the second high voltage NMOS transistor 34, and to a drain of the second high voltage PMOS transistor 36. The voltage source 77 further includes a negative terminal electrically connected to the first end of the first current source 41 and to the sources of the first and second input NMOS transistors 31, 32.

The bias control block 74 can aid in controlling the gate voltages of the high voltage transistors 33-36. The NMOS transistor 76 is diode connected. For example, the NMOS transistor 76 can be self-biased and have a drain-source current that is about equal to the current of the current source 75, and the gate voltage of the NMOS transistor 76 can be used to control the gate voltages of the first and second high voltage NMOS transistors 33, 34. In some implementations, the transistor 76 can be a replica transistor, which can have the same size as the first and second high voltage NMOS transistors 33, 34 or which can be scaled down in size relative to the first and second high voltage NMOS transistors 33, 34 with an appropriate scaling down of the current source 75.

The first and second amplification blocks 78, 79 can be used to control the gate voltages of the first and second high voltage PMOS transistors 35, 36 to a voltage level associated with a desired drain-source voltage of the first and second input NMOS transistors 31, 32. For example, the first amplification block 78 can be used to control the gate voltage of the first high voltage PMOS transistor 35 so as to control a magnitude of the drain-source voltage of the first input NMOS transistor 31 to be about equal to a voltage magnitude of the voltage source 77. Similarly, the second amplification block 79 can be used to control the gate voltage of the second high voltage PMOS transistor 36 so as to control a magnitude of the drain-source voltage of the second input NMOS transistor 32 to be about equal to a voltage magnitude of the voltage source 77. Accordingly, the bias control block 74 and the high voltage transistors 53-56 can be used to maintain the drain-source voltages of the first and second input NMOS transistors 31, 32 within safe operating limits so as to protect the input NMOS transistors from breakdown. Biasing the first and second input NMOS transistors 31, 32 in this manner can also provide additional benefits, such as improving the linearity of the first and second input NMOS transistors 31, 32 by reducing the impacts of channel-length modulation.

In one embodiment, the bias control block 74 can be configured to control the gate voltages of the first and second high voltage NMOS transistors 33, 34 such that the first and second high voltage NMOS transistors 33, 34 are biased with currents about equal to the drain-source currents of the first and second input NMOS transistors 31, 32, respectively, when the common-mode input voltage of the non-inverted and inverted inputs $V_{in+}$, $V_{in-}$ is relatively low. Additionally, for relatively low common-mode input voltages, the bias control block 74 can be configured to bias the first and second high voltage PMOS transistors 35, 36 in a cutoff mode of operation. By biasing the high voltage transistors 33-36 in this manner, at low common-mode input voltages, the first and second high voltage NMOS transistors 33, 34 can be configured to operate in a cascode configuration with the first and second input NMOS transistors 31, 32, and the first and second high voltage PMOS transistors 35, 36 can be turned off. However, when the common-mode input voltage level increases, the magnitude of the gate-source bias voltages of the first and second high voltage NMOS transistors 33, 34 can decrease, and the bias control block 74 can be configured to increase the current through the first and second high voltage PMOS transistors 35, 36. Thus, at high common-mode input voltages, the first and second high voltage PMOS transistors 35, 36 can be biased with currents about equal to the drain-source currents of the first and second input NMOS transistors 31, 32, respectively, and the first and second high voltage NMOS transistors 33, 34 can be turned off.

The voltage source 77 can be any suitable voltage source component. For example, in some implementations, the voltage source 77 can be a resistor configured to receive a bias current. However, any other suitable implementation of the voltage source 77 can be used, including configurations using transistor and/or diode structures. The magnitude of the voltage of the voltage source 77 can be selected to be equal to the desired value of the drain-source voltage of the first and second input NMOS transistors 31, 32. In some implementations, the voltage magnitude of the voltage source is selected to be in the range of about 100 mV to about 500 mV, for example, about 200 mV. However, other voltage magnitudes values will be readily determined by one of ordinary skill in the art.

The inclusion of the high voltage transistors 33-36 and the bias control block 74 can permit low voltage transistors to be used for the first and second input NMOS transistors 31, 32, even when common-mode swing on the drains of the first and second input NMOS transistors 31, 32 would otherwise cause breakdown. Low voltage transistors can have a greater transconductor per unit of current, lower Flicker noise per unit of area, and/or lower voltage offset per unit of area than high voltage transistors. The bias control block 74 can be configured to bias the gates of the high voltage transistors 33-36 such that the drain-source voltages of the first and second input NMOS transistors 31, 32 are relatively constant over the common-mode input voltage operating range of the amplification block 70. Including both the high voltage NMOS transistors 33, 34 and the high voltage PMOS transistors 35, 36 can help prevent the high voltage transistors from impacting the common-mode input voltage operating range of the amplification block 70 relative to a scheme including only the high voltage NMOS transistors 33, 34 or only the high voltage PMOS transistors 35, 36. For example, a configuration using only the high voltage NMOS transistors 33, 34 or only the high voltage PMOS transistors 35, 36 can have a common-mode input voltage operating range limited by voltage headroom associated with biasing the high voltage transistors.

Figure 3B:
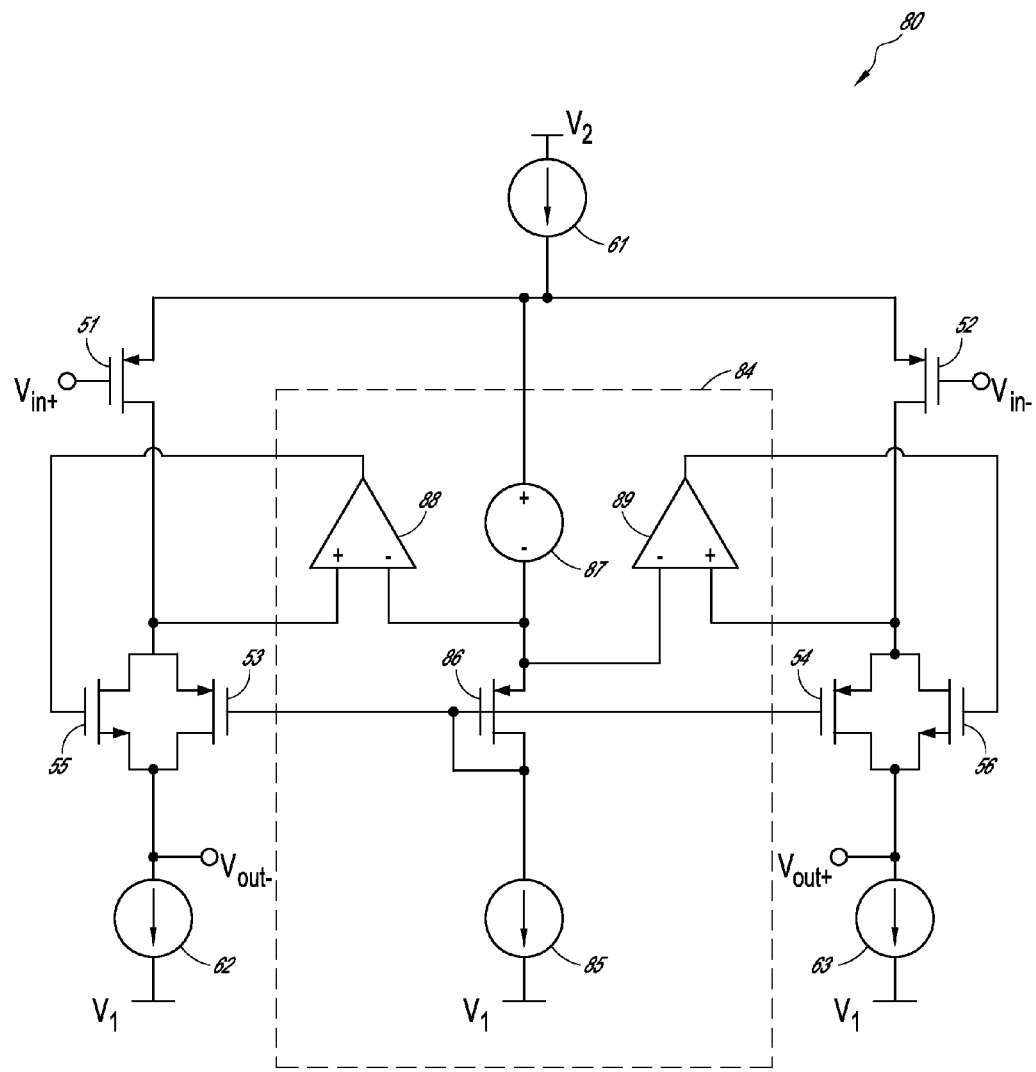
FIG. 3B is a circuit diagram of an amplification stage according to yet another embodiment.

FIG. 3B is a circuit diagram of an amplification stage 80 according to yet another embodiment. The amplification stage 80 includes the first input PMOS transistor 51, the second input PMOS transistor 52, the first high voltage PMOS transistor 53, the second high voltage PMOS transistor 54, the first high voltage NMOS transistor 55, the second high voltage NMOS transistor 56, the first current source 61, the second current source 62, the third current source 63, and a bias control block 84.

The amplification stage 80 further includes a first or non-inverted voltage input $V_{in+}$, a second or inverted voltage input $V_{in-}$, a first or non-inverted voltage output $V_{out+}$ and a second or inverted voltage output $V_{out-}$. The amplification stage 80 can receive a differential input voltage signal between the non-inverted and inverted voltage inputs $V_{in+}$, $V_{in-}$ and can amplify the differential input voltage signal to generate a differential output voltage signal between the non-inverted and inverted voltage outputs $V_{out+}$, $V_{out-}$.

The amplification stage 80 is electrically connected in the configuration described earlier with reference to FIG. 2B. The bias control block 84 of FIG. 3B illustrates one implementation of the bias control block 64 of FIG. 2B. However, other implementations of the bias control block 84 are possible.

The bias control block 84 includes a current source 85, a PMOS transistor 86, a voltage source 87, a first amplification block 88, and a second amplification block 89. The current source 85 includes a first end electrically connected to the first supply voltage $V_1$ and a second end electrically connected to a drain and gate of the PMOS transistor 86 and to the gates of the first and second high voltage PMOS transistors 53, 54. The PMOS transistor 86 further includes a source electrically connected to an inverted input of the first amplification block 88, to an inverted input of the second amplification block 89, and to a negative terminal of the voltage source 87. The first amplification block 88 further includes an output electrically connected to a gate of the first high voltage NMOS transistor 55 and a non-inverted input electrically connected to a drain of the first input PMOS transistor 51, to a source of the first high voltage PMOS transistor 53, and to a drain of the first high voltage NMOS transistor 55. The second amplification block 89 further includes an output electrically connected to a gate of the second high voltage NMOS transistor 56 and a non-inverted input electrically connected to a drain of the second input PMOS transistor 52, to a source of the second high voltage PMOS transistor 54, and to a drain of the second high voltage NMOS transistor 56. The voltage source 87 further includes a positive terminal electrically connected to the first end of the first current source 61 and to the sources of the first and second input PMOS transistors 51, 52.

The bias control block 84 can aid in controlling the gate voltages of the high voltage transistors 53-56. The PMOS transistor 86 is diode connected. For example, the PMOS transistor 86 can be self-biased and have a source-drain current that is about equal to the current of the current source 85, and the gate voltage of the PMOS transistor 86 can be used to control the gate voltages of the first and second high voltage PMOS transistors 53, 54. In some implementations, the PMOS transistor 86 can be a replica transistor, which can have the same size as the first and second high voltage PMOS transistors 53, 54 or which can be scaled down in size relative to the first and second high voltage PMOS transistors 53, 54 with an appropriate scaling down of the current source 85.

Additionally, the first and second amplification blocks 88, 89 can be used to control the gate voltages of the first and second high voltage NMOS transistors 55, 56 to a voltage level associated with a desired drain-source voltage of the first and second input PMOS transistors 51, 52. For example, the first amplification block 88 can be used to control the gate voltage of the first high voltage NMOS transistor 55 so as to control a magnitude of the drain-source voltage of the first input PMOS transistor 51 to be about equal to a voltage magnitude of the voltage source 87. Similarly, the second amplification block 89 can be used to control the gate voltage of the second high voltage NMOS transistor 56 so as to control a magnitude of the drain-source voltage of the second input PMOS transistor 52 to be about equal to a voltage magnitude of the voltage source 87. Additional details of the voltage source 87 can be similar to those described earlier with respect to the voltage source 77 of FIG. 3A.

In one embodiment, the bias control block 84 can be configured to control the gate voltages of the first and second high voltage PMOS transistors 53, 54 such that the first and second high voltage PMOS transistors 53, 54 are biased with currents about equal to the drain-source currents of the first and second input PMOS transistors 51, 52, respectively, when the common-mode input voltage of the non-inverted and inverted inputs $V_{in+}$, $V_{in-}$ is relatively high. Additionally, for relatively high common-mode input voltages, the bias control block 84 can be configured to bias the first and second high voltage NMOS transistors 55, 56 to be off. However, when the common-mode input voltage level is relatively low, the first and second high voltage NMOS transistors 55, 56 can be biased with currents about equal to the drain-source currents of the first and second input PMOS transistors 51, 52, respectively, and the first and second high voltage PMOS transistors 53, 54 can be off. By configuring the high voltage transistors 53-56 in this manner, the high voltage transistors 53-56 can be configured to pass the bias current of the first and second input PMOS transistors 51, 52 over a wide range of input voltages, thereby increasing the input voltage operating range of the amplification stage 80 relative to a scheme in which voltage headroom associated with biasing one or more high voltage transistors limits the common-mode input voltage range.

Figure 4:
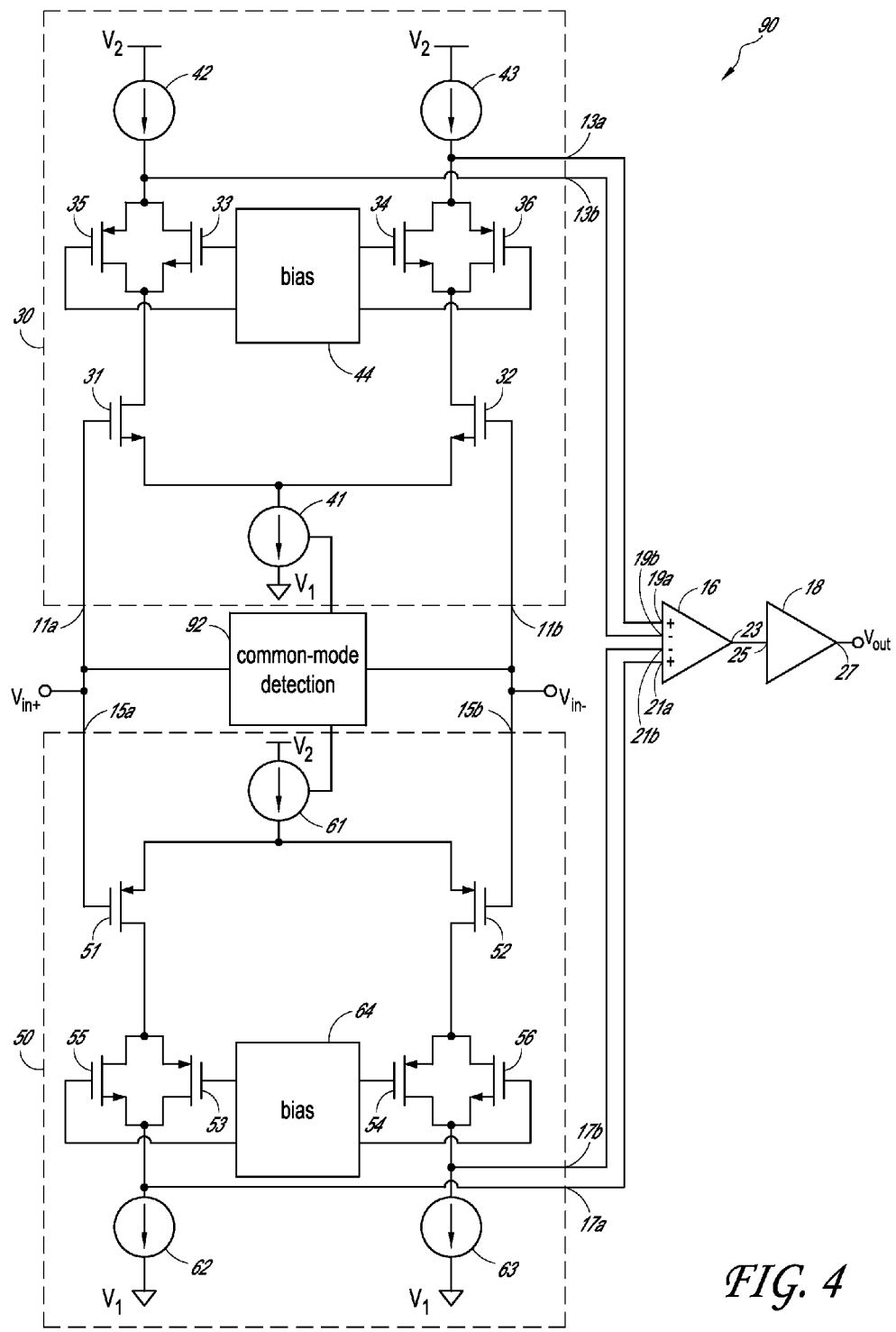
FIG. 4 is a circuit diagram of an amplifier according to one embodiment.

FIG. 4 is a circuit diagram of an amplifier 90 according to one embodiment. The amplifier 90 includes a first amplification stage 30, a second amplification stage 50, the third amplification stage 16, the fourth amplification stage 18, and a common-mode detection block 92. The amplifier 90 further includes a non-inverted voltage input $V_{in+}$, an inverted voltage input $V_{in-}$, and a voltage output $V_{out}$. The amplifier 90 can be used, for example, as an operational amplifier.

The amplifier 90 is electrically connected in the configuration described earlier with respect to FIG. 1B. For example, the non-inverted voltage input $V_{in+}$ of the amplifier 90 is electrically connected to a non-inverted input 11a of the first amplification stage 30 and to a non-inverted input 15a of the second amplification stage 50. Additionally, the inverted voltage input $V_{in-}$ of the amplifier 90 is electrically connected to an inverted input 11b of the first amplification stage 30 and to an inverted input 15b of the second amplification stage 50. Furthermore, a non-inverted output 13a and an inverted output 13b of the first amplification stage 30 are electrically connected to a first non-inverted input 19a and a first inverted input 19b of the third amplification stage 16, respectively. Additionally, a non-inverted output 17a and an inverted output 17b of the second amplification stage 50 are electrically connected to a second non-inverted input 21a and a second inverted input 21b of the third amplification stage 16, respectively. Furthermore, an output 23 of the third amplification stage 16 is electrically connected to an input 25 of the fourth amplification stage 18, and an output 27 of the fourth amplification stage 18 is electrically connected to the voltage output $V_{out}$ of the amplifier 90.

The first amplification stage 30 includes the first input NMOS transistor 31, the second input NMOS transistor 32, the first high voltage NMOS transistor 33, the second high voltage NMOS transistor 34, the first high voltage PMOS transistor 35, the second high voltage PMOS transistor 36, the first current source 41, the second current source 42, the third current source 43, and the bias control block 44. Additional details of the first amplification stage 30 can be as described earlier. In one embodiment, the bias control block 74 of FIG. 3A is used as the bias control block 44.

The second amplification stage 50 includes the first input PMOS transistor 51, the second input PMOS transistor 52, the first high voltage PMOS transistor 53, the second high voltage PMOS transistor 54, the first high voltage NMOS transistor 55, the second high voltage NMOS transistor 56, the first current source 61, the second current source 62, the third current source 63, and the bias control block 64. Additional details of the second amplification stage 50 can be as described earlier. In one embodiment, the bias control block 84 of FIG. 3B is used as the bias control block 64.

The amplifier 90 includes the first and second amplification stages 30, 50 for operating as input stages of the amplifier 90. The amplifier 90 further includes the common-mode detection block 92, which can be used to sense a common-mode voltage level of the non-inverted and inverted voltage inputs $V_{in+}$, $V_{in-}$ and to enable or disable the first and second amplification stages 30, 50 based on the sensed common-mode voltage level.

In one embodiment, the common-mode detection block 92 can be configured to enable the first current source 41 of the first amplification block 30 and to disable the first current source 61 of the second amplification block 50 when the common-mode voltage of the non-inverted and inverted voltage inputs $V_{in+}$, $V_{in-}$ is relatively high. Additionally, the common-mode detection block 92 can be configured to disable the first current source 41 of the first amplification block 30 and enable the first current source 61 of the second amplification block 50 when the common-mode voltage of the non-inverted and inverted voltage inputs $V_{in+}$, $V_{in-}$ is relatively low. By configuring the common-mode detection block 92 in this manner, the amplifier 90 can be configured to operate over a wide range of common-mode input voltages, including, for example, over a common-mode input voltage range extending at least between the first power supply $V_1$ and the second power supply $V_2$.

Figure 5:
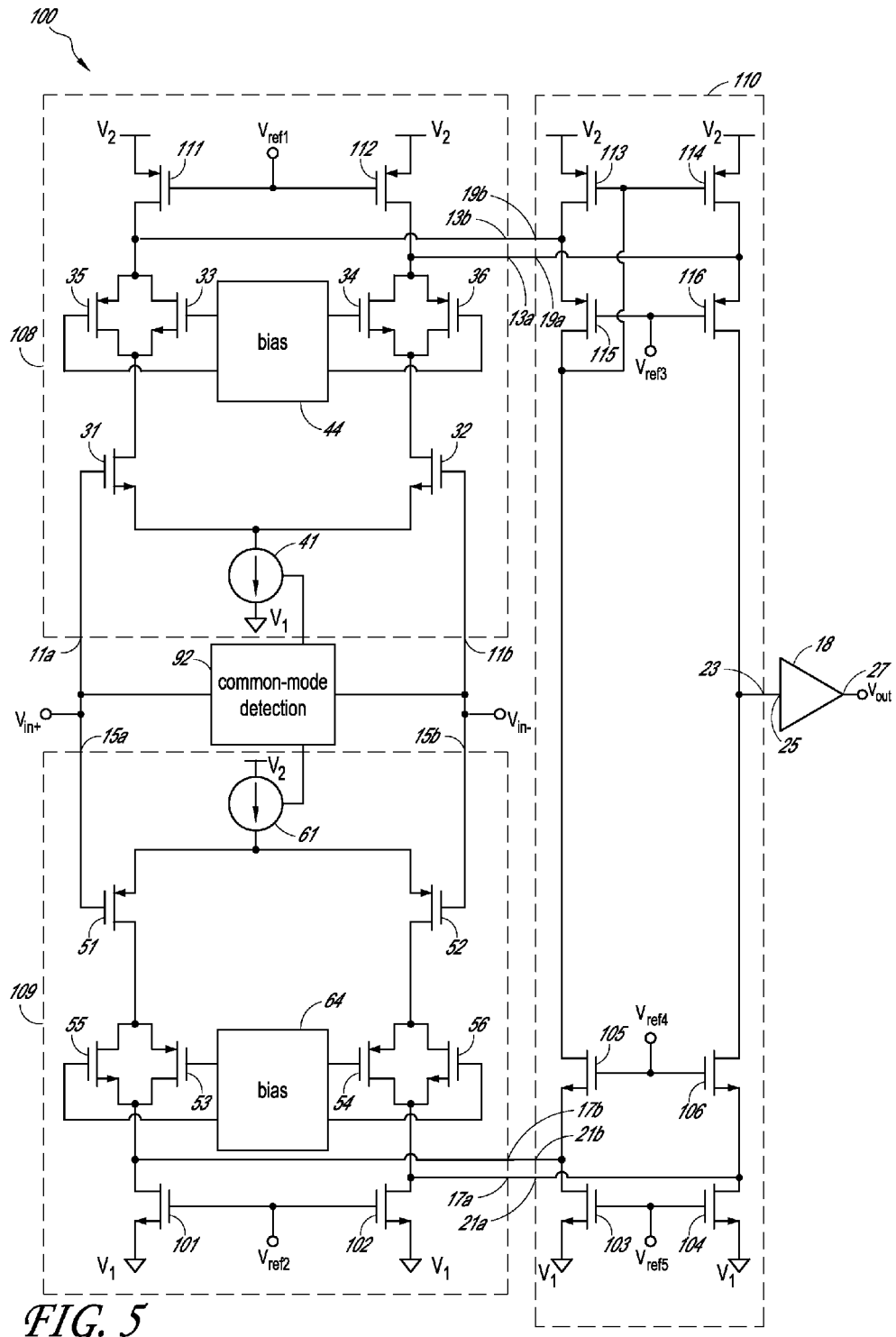
FIG. 5 is a circuit diagram of an amplifier according to another embodiment.

FIG. 5 is a circuit diagram of an amplifier 100 according to another embodiment. The amplifier 100 includes a first amplification stage 108, a second amplification stage 109, a third amplification stage 110, the fourth amplification stage 18, and the common-mode detection block 92. The amplifier 100 further includes a non-inverted voltage input $V_{in+}$, an inverted voltage input $V_{in-}$, and a voltage output $V_{out}$. The amplifier 100 can be used, for example, as an operational amplifier.

The amplifier 100 is electrically connected in the configuration described earlier with respect to FIG. 1B. For example, the non-inverted voltage input $V_{in+}$ of the amplifier 100 is electrically connected to a non-inverted input 11a of the first amplification stage 108 and to a non-inverted input 15a of the second amplification stage 109. Additionally, the inverted voltage input $V_{in-}$ of the amplifier 100 is electrically connected to an inverted input 11b of the first amplification stage 108 and to an inverted input 15b of the second amplification stage 109. Furthermore, a non-inverted output 13a and an inverted output 13b of the first amplification stage 108 are electrically connected to a first non-inverted input 19a and a first inverted input 19b of the third amplification stage 110, respectively. Additionally, a non-inverted output 17a and an inverted output 17b of the second amplification stage 109 are electrically connected to a second non-inverted input 21a and a second inverted input 21b of the third amplification stage 110, respectively. Furthermore, an output 23 of the third amplification stage 110 is electrically connected to an input 25 of the fourth amplification stage 18, and an output 27 of the fourth amplification stage 18 is electrically connected to the voltage output $V_{out}$ of the amplifier 100.

The first amplification stage 108 of FIG. 5 is similar to the first amplification stage 30 of FIG. 4. However, in contrast to the first amplification stage 30 of FIG. 4, which includes the second and third current sources 42, 43, the first amplification stage 108 includes first and second current source PMOS transistors 111, 112. For example, the first current source PMOS transistor 111 includes a source electrically connected to the second supply voltage $V_2$, a gate electrically connected to a gate of the second current source PMOS transistor 112 and to a first voltage reference $V_{ref1}$, and a drain electrically connected to a source of the first high voltage PMOS transistor 35, to a drain of the first high voltage NMOS transistor 33, and to the inverted output 19b of the first amplification block 108. Additionally, the second current source PMOS transistor 112 further includes a source electrically connected to the second supply voltage $V_2$ and a drain electrically connected to a source of the second high voltage PMOS transistor 36, to a drain of the second high voltage NMOS transistor 34, and to the non-inverted output 19a of the first amplification block 108.

The second amplification stage 109 of FIG. 5 is similar to the second amplification stage 50 of FIG. 4. However, in contrast to the second amplification stage 50 of FIG. 4, which includes the second and third current sources 62, 63, the second amplification stage 109 includes first and second current source NMOS transistors 101, 102. For example, the first current source NMOS transistor 101 includes a source electrically connected to the first supply voltage $V_1$, a gate electrically connected to a gate of the second current source NMOS transistor 102 and to a second voltage reference $V_{ref2}$, and a drain electrically connected to a source of the first high voltage NMOS transistor 55, to a drain of the first high voltage PMOS transistor 53, and to the inverted output 17b of the second amplification block 109. Additionally, the second current source NMOS transistor 102 further includes a source electrically connected to the first supply voltage $V_1$ and a drain electrically connected to a source of the second high voltage NMOS transistor 56, to a drain of the second high voltage PMOS transistor 54, and to the non-inverted output 17a of the second amplification block 109.

The third amplification stage 110 includes first to fourth PMOS transistors 113-114 and first to fourth NMOS transistors 103-106. The first PMOS transistor 113 includes a source electrically connected to the second supply voltage $V_2$, a drain electrically connected to a source of the third PMOS transistor 115 and to the first inverted input 19b, and a gate electrically connected to a gate of the second PMOS transistor 114, to a drain of the third PMOS transistor 115, and to a drain of the third NMOS transistor 105. The second PMOS transistor 114 further includes a source electrically connected to the second supply voltage $V_2$ and a drain electrically connected to a source of the fourth PMOS transistor 116 and to the first non-inverted input 19a. The fourth PMOS transistor 116 further includes a gate electrically connected to a gate of the third PMOS transistor 115 and to a third reference voltage $V_{ref3}$, and a drain electrically connected to a drain of the fourth NMOS transistor 106 and to the output 23. The fourth NMOS transistor 106 further includes a gate electrically connected to a gate of the third NMOS transistor 105 and to a fourth reference voltage $V_{ref4}$, and a source electrically connected to a drain of the second NMOS transistor 104 and to the second non-inverted input 21a. The second NMOS transistor 104 further includes a source electrically connected to the first supply voltage $V_1$ and a gate electrically connected to a gate of the first NMOS transistor 103 and to a fifth reference voltage $V_{ref5}$. The first NMOS transistor 103 further includes a source electrically connected to the first supply voltage $V_1$ and a drain electrically connected to a source of the third NMOS transistor 105 and to the second inverted input 21b.

The first to fifth reference voltages $V_{ref1}$-$V_{ref5}$ can be any suitable reference voltages. In one implementation, the voltage level of the first reference voltage $V_{ref1}$ is selected to be in the range of about 0.7 V less to about 1.0 V less than the second supply voltage $V_2$, the voltage level of the second reference voltage $V_{ref2}$ is selected to be in the range of about 0.6 V more to about 0.9 V more than the first supply voltage $V_1$, the voltage level of the third reference voltage $V_{ref3}$ is selected to be in the range of about 1.1 V less to about 1.4 V less than the second supply voltage $V_2$, the voltage level of the fourth reference voltage $V_{ref4}$ is selected to be in the range of about 1.0 V more to about 1.3 V more than the first supply voltage $V_1$, and the voltage level of the fifth reference voltage $V_{ref5}$ is selected to be in the range of about 0.6 V more to about 0.9 V more than the first supply voltage $V_1$. However, other voltage levels will be readily determined by one of ordinary skill in the art.

Figure 6:
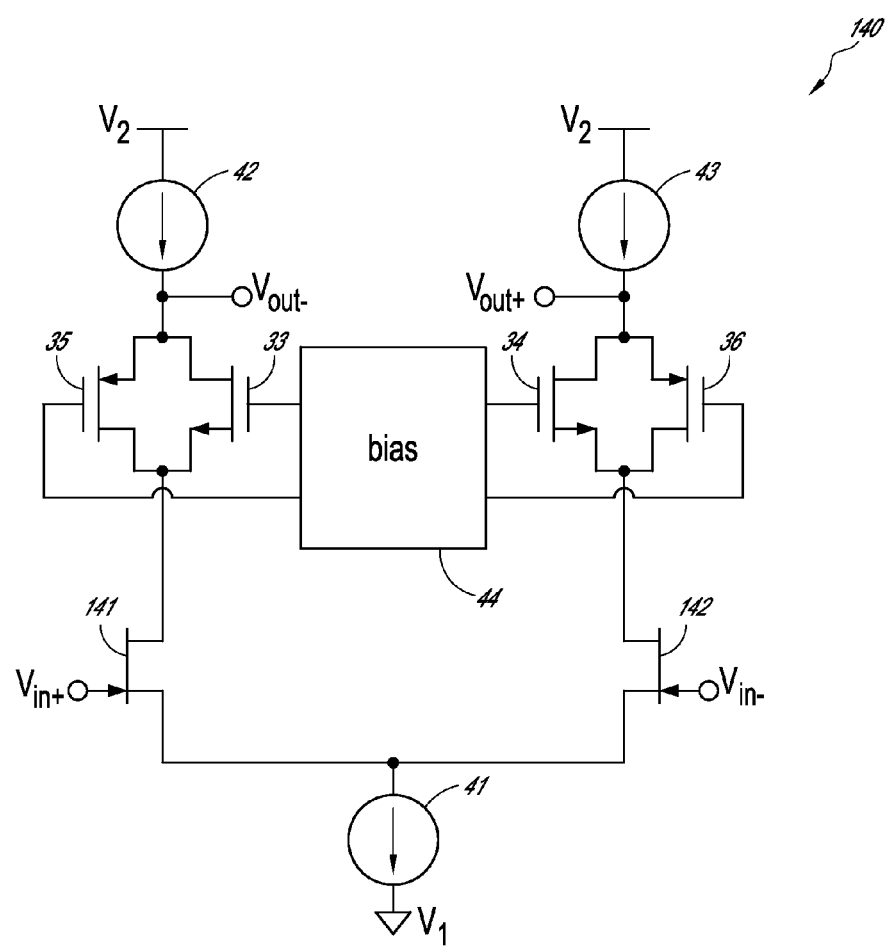
FIG. 6 is a circuit diagram of an amplification stage according to yet another embodiment.

FIG. 6 is a circuit diagram of an amplification stage 140 according to yet another embodiment. The amplification stage 140 includes a first input junction field-effect transistor (JFET) 141, a second input JFET transistor 142, the first NMOS transistor 33, the second NMOS transistor 34, the first PMOS transistor 35, the second PMOS transistor 36, the first current source 41, the second current source 42, the third current source 43, and the bias control block 44.

The amplification stage 140 of FIG. 6 is similar to the first amplification stage 30 of FIG. 2A. However, in contrast to the amplification stage 30 of FIG. 2A, which uses NMOS transistors as input transistors, the amplification stage 140 of FIG. 6 uses the JFET transistors 141, 142 as input transistors. For example, the first input JFET transistor 141 includes a gate electrically connected to the non-inverted voltage input $V_{in+}$, a source electrically connected to a source of the second input JFET transistor 142 and to the first end of the first current source 41, and a drain electrically connected to a source of the first NMOS transistor 33 and to a drain of the first PMOS transistor 35. Similarly, the second input JFET transistor 142 includes a gate electrically connected to the inverted voltage input $V_{in-}$, a source electrically connected to a source of the first input JFET transistor 141 and to the first end of the first current source 41, and a drain electrically connected to a source of the second NMOS transistor 34 and to a drain of the second PMOS transistor 36. In the illustrated configuration, the gates of the first and second input JFET transistors 141, 142 operate as transistor inputs and the drains of the first and second input JFET transistors 141, 142 operate as transistor outputs.

Although FIG. 6 illustrates a configuration using n-type input JFET transistors, the amplification stage 140 can be adapted to include p-type JFET input transistors. For example, the first and second input PMOS transistors 51, 52 of the amplification stage 50 of FIG. 2B or the amplification stage 80 of FIG. 3B can be replaced with p-type JFET transistors.

Figure 7:
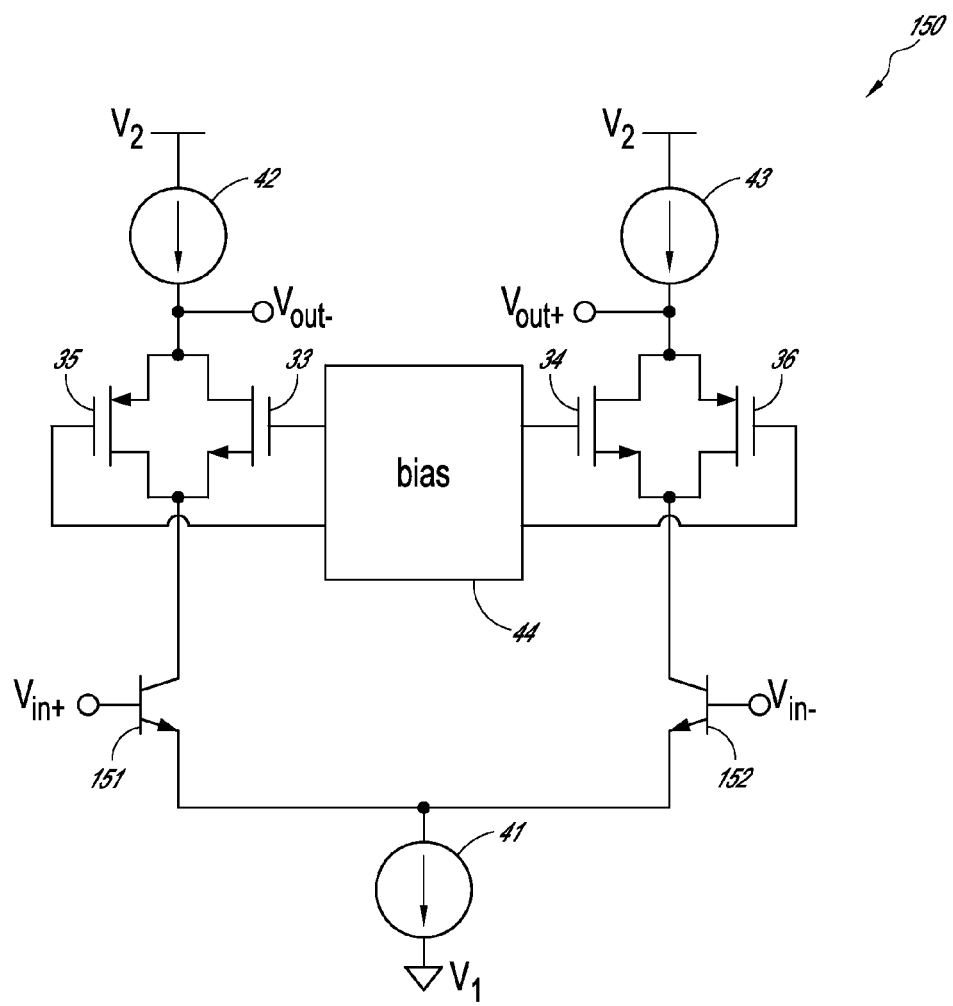
FIG. 7 is a circuit diagram of an amplification stage according to yet another embodiment.

FIG. 7 is a circuit diagram of an amplification stage 150 according to yet another embodiment. The amplification stage 150 includes a first input bipolar transistor 151, a second input bipolar transistor 152, the first NMOS transistor 33, the second NMOS transistor 34, the first PMOS transistor 35, the second PMOS transistor 36, the first current source 41, the second current source 42, the third current source 43, and the bias control block 44.

The amplification stage 150 of FIG. 7 is similar to the first amplification stage 30 of FIG. 2A. However, in contrast to the amplification stage 30 of FIG. 2A, which includes NMOS transistors as input transistors, the amplification stage 150 of FIG. 7 uses the bipolar transistors 151, 152 as input transistors. For example, the first input bipolar transistor 151 includes a base electrically connected to the non-inverted voltage input $V_{in+}$, an emitter electrically connected to an emitter of the second input bipolar transistor 152 and to the first end of the first current source 41, and a collector electrically connected to a source of the first NMOS transistor 33 and to a drain of the first PMOS transistor 35. Similarly, the second input bipolar transistor 152 includes a base electrically connected to the inverted voltage input $V_{in-}$, a source electrically connected to an emitter of the first input bipolar transistor 151 and to the first end of the first current source 41, and a collector electrically connected to a source of the second NMOS transistor 34 and to a drain of the second PMOS transistor 36. In the illustrated configuration, the bases of the first and second input bipolar transistors 151, 152 operate as transistor inputs and the collectors of the first and second input bipolar transistors 151, 152 operate as transistor outputs.

Although FIG. 7 illustrates a configuration using n-type input bipolar transistors, the amplification stage 150 can be adapted to include p-type bipolar transistors. For example, the first and second input PMOS transistors 51, 52 of the amplification stage 50 of FIG. 2B or the amplification stage 80 of FIG. 3B can be replaced with p-type bipolar transistors.

As illustrated in FIGS. 6 and 7, any suitable differential pair can be used as input transistors for the amplification stages described herein. For example, the input transistors can be any suitable field-effect transistor and/or bipolar transistor, and the cascaded transistors can be any suitable field-effect transistor. Accordingly, in some implementations, a first n-type field-effect transistor (NFET) and a first p-type field-effect transistor (PFET) transistor can be electrically connected in parallel and configured such that the channels of the first NFET and PFET transistors are disposed in a signal path between the output of a first input transistor and a first output of the amplification stage. Similarly, a second NFET transistor and a second PFET transistor can be electrically connected in parallel and configured such that the channels of the second NFET and PFET transistors are disposed in a signal path between the output of a second input transistor and a second output of the amplification stage.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. For example, amplifiers having amplification stages can be used in consumer electronic products, parts of the consumer electronic products, electronic test equipment, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
 a first amplification stage having a first input, a second input, a first output and a second output, the first amplification stage comprising:
  a first transistor of a first polarity, wherein the first transistor comprises an input electrically connected to the first input;
  a second transistor of the first polarity, wherein the second transistor comprises an input electrically connected to the second input, and wherein the first and second transistors are configured to operate as a differential pair;
  a third transistor of the first polarity, the third transistor comprising a channel disposed in a signal path between an output of the first transistor and the second output;
  a fourth transistor of a second polarity opposite the first polarity, the fourth transistor comprising a channel electrically connected in parallel with the channel of the third transistor and disposed in a signal path between the output of the first transistor and the second output;
  a fifth transistor of the first polarity, the fifth transistor comprising a channel disposed in a signal path between an output of the second transistor and the first output;
  a sixth transistor of the second polarity, the sixth transistor comprising a channel electrically connected in parallel with the channel of the fifth transistor and disposed in a signal path between the output of the second transistor and the first output.

2. The apparatus of claim 1, wherein the first polarity is n-type and the second polarity is p-type.

3. The apparatus of claim 2, wherein the third and fifth transistors are NMOS transistors and the fourth and sixth transistors are PMOS transistors.

4. The apparatus of claim 1, wherein the first polarity is p-type and the second polarity is n-type.

5. The apparatus of claim 1, wherein the first and second transistors are field-effect transistors, and wherein the input of the first transistor is a gate, the output of the first transistor is a drain, the input of the second transistor is a gate, and the output of the second transistor is a drain.

6. The apparatus of claim 1, wherein the first and second transistors are bipolar transistors, and wherein the input of the first transistor is a base, the output of the first transistor is a collector, the input of the second transistor is a base, and the output of the second transistor is a collector.

7. The apparatus of claim 1, wherein the third and fourth transistors each have a breakdown voltage greater than a breakdown voltage of the first transistor, and wherein the fifth and sixth transistors each have a breakdown voltage greater than a breakdown voltage of the second transistor.

8. The apparatus of claim 7, further comprising a bias control block configured to control a gate voltage of the third transistor, a gate voltage of the fourth transistor, a gate voltage of the fifth transistor, and a gate voltage of the sixth transistor.

9. The apparatus of claim 8, wherein the first and second transistors are field-effect transistors, and wherein the input of the first transistor is a gate, the output of the first transistor is a drain, the input of the second transistor is a gate, and the output of the second transistor is a drain, and wherein the bias control block is configured to control the gate voltages of the third and fourth transistors so as to control a difference between a voltage of the drain of the first transistor and a voltage of a source of the first transistor, and wherein the bias control block is further configured to control the gate voltages of the fifth and sixth transistors so as to control a difference between a voltage of the drain of the second transistor and a voltage of a source of the second transistor.

10. The apparatus of claim 9, wherein the first polarity is n-type and the second polarity is p-type, and wherein the bias control block is configured to turn off the fourth and sixth transistors when a common-mode voltage of the first and second inputs is less than a first common-mode voltage level.

11. The apparatus of claim 10, wherein the bias control block further comprises a voltage source and a first amplification block, wherein the voltage source comprises a first end electrically connected to a source of a bias transistor and a second end electrically connected to the sources of the first and second transistors, and wherein the first amplification block comprises a first input electrically connected to the first end of the voltage source, a second input electrically connected to a drain of the first transistor, and an output configured to control the gate voltage of the fourth transistor.

12. The apparatus of claim 11, wherein the bias control block further comprises a second amplification block, the second amplification block comprising a first input electrically connected to the first end of the voltage source, a second input electrically connected to a drain of the second transistor, and an output configured to control the gate voltage of the sixth transistor.

13. The apparatus of claim 9, further comprising a first current source electrically connected to the sources of the first and second transistors.

14. The apparatus of claim 13, further comprising a second current source and a third current source, wherein the second current source is electrically connected to a drain of the third transistor and to a source of the fourth transistor, and wherein the third current source is electrically connected to a drain of the fifth transistor and to a source of the sixth transistor.

15. The apparatus of claim 14, wherein the second current source comprises a first current source transistor of the second type and the third current source comprises a second current source transistor of the second type, wherein the first current source transistor comprises a drain electrically connected to the second output, a source electrically connected to a power supply voltage node, and a gate electrically connected to a gate of the second current source transistor, and wherein the second current source transistor further comprises a drain electrically connected to the first output, and a source electrically connected to the power supply voltage node.

16. The apparatus of claim 1, further comprising a second amplification stage having a first input, a second input, a first output and a second output, the second amplification stage comprising:
a first transistor of the second polarity, wherein the first transistor comprises an input electrically connected to the first input;
a second transistor of the second polarity, wherein the second transistor comprises an input electrically connected to the second input, and wherein the first and second transistors are configured to operate as a differential pair;
a third transistor of the second polarity, the third transistor comprising a channel disposed in a signal path between an output of the first transistor and the second output;
a fourth transistor of the first polarity, the fourth transistor comprising a channel electrically connected in parallel with the channel of the third transistor and disposed in a signal path between the output of the first transistor and the second output;
a fifth transistor of the second polarity, the fifth transistor comprising a channel disposed in a signal path between an output of the second transistor and the first output; and
a sixth transistor of the first polarity, the sixth transistor comprising a channel electrically connected in parallel with the channel of the fifth transistor and disposed in a signal path between the output of the second transistor and the first output,
wherein the first inputs of the first and second amplification stages are electrically connected to each other to operate as a first amplifier input and wherein the second inputs of the first and second amplification stages are electrically connected to each other to operate as a second amplifier input.

17. The apparatus of claim 16, further comprising a common-mode detection block for detecting a common-mode voltage level of the first and second amplifier inputs, the common-mode detection block configured to enable the second amplification block when the common-mode voltage level is relatively low and to enable the first amplification block when the common-mode voltage level is relatively high.

18. The apparatus of claim 1, wherein the first input is a non-inverted voltage input, the second input is an inverted voltage input, the first output is a non-inverted voltage output, and the second output is an inverted voltage output.

19. A method of electronic amplification, the method comprising:
amplifying a differential input voltage signal using a first transistor and a second transistor, wherein the first and second transistors are each of a first type;
regulating a drain-to-source voltage of the first transistor using a third transistor and a fourth transistor, wherein the third transistor is of the first polarity and the fourth transistor is of a second polarity opposite the first polarity, and wherein the third transistor comprises a channel disposed in a signal path between a drain of the first transistor and a power supply voltage node, and wherein the fourth transistor comprises a channel electrically connected in parallel with the channel of the third transistor and disposed in the electrical path between the drain of the first transistor and the power supply voltage node; and
regulating a drain-to-source voltage of the second transistor using a fifth transistor and a sixth transistor, wherein the fifth transistor is of the first polarity and the sixth transistor is of the second polarity, and wherein the fifth transistor comprises a channel disposed in an electrical path between a drain of the second transistor and the power supply voltage node, and wherein the sixth transistor comprises a channel electrically connected in parallel with the channel of the fifth transistor and disposed in the signal path between the drain of the second transistor and the power supply voltage nod;

wherein the third and fourth transistors each have a breakdown voltage greater than a breakdown voltage of the first transistor, and wherein the fifth and sixth transistors each have a breakdown voltage greater than a breakdown voltage of the second transistor.

20. The method of claim 19, wherein the first polarity is n-type and the second polarity is p-type.

21. A method of electronic amplification, the method comprising:
amplifying a differential input voltage signal using a first transistor and a second transistor, wherein the first and second transistors are each of a first type;
regulating a drain-to-source voltage of the first transistor using a third transistor and a fourth transistor, wherein the third transistor is of the first polarity and the fourth transistor is of a second polarity opposite the first polarity, and wherein the third transistor comprises a channel disposed in a signal path between a drain of the first transistor and a power supply voltage node, and wherein the fourth transistor comprises a channel electrically connected in parallel with the channel of the third transistor and disposed in the electrical path between the drain of the first transistor and the power supply voltage node;
regulating a drain-to-source voltage of the second transistor using a fifth transistor and a sixth transistor, wherein the fifth transistor is of the first polarity and the sixth transistor is of the second polarity, and wherein the fifth transistor comprises a channel disposed in an electrical path between a drain of the second transistor and the power supply voltage node, and wherein the sixth transistor comprises a channel electrically connected in parallel with the channel of the fifth transistor and disposed in the signal path between the drain of the second transistor and the power supply voltage node;
controlling a gate voltage of the third transistor and a gate voltage of the fourth transistor such that the drain-to-source voltage of the first transistor is substantially constant; and
controlling a gate voltage of the fifth transistor and a gate voltage of the sixth transistor such that the drain-to-source voltage of the second transistor and the source of the second transistor is substantially constant.

22. The method of claim 21, wherein the gate voltage of the fourth transistor and the gate voltage of the sixth transistor are controlled by feedback loops such that a source voltage of the fourth transistor and a source voltage of the sixth transistor are regulated to a voltage of a voltage source.

23. A method of electronic amplification, the method comprising:
amplifying a differential input voltage signal using a first transistor and a second transistor, wherein the first and second transistors are each of a first type;
regulating a drain-to-source voltage of the first transistor using a third transistor and a fourth transistor, wherein the third transistor is of the first polarity and the fourth transistor is of a second polarity opposite the first polarity, and wherein the third transistor comprises a channel disposed in a signal path between a drain of the first transistor and a power supply voltage node, and wherein the fourth transistor comprises a channel electrically connected in parallel with the channel of the third transistor and disposed in the electrical path between the drain of the first transistor and the power supply voltage node;
regulating a drain-to-source voltage of the second transistor using a fifth transistor and a sixth transistor, wherein the fifth transistor is of the first polarity and the sixth transistor is of the second polarity, and wherein the fifth transistor comprises a channel disposed in an electrical path between a drain of the second transistor and the power supply voltage node, and wherein the sixth transistor comprises a channel electrically connected in parallel with the channel of the fifth transistor and disposed in the signal path between the drain of the second transistor and the power supply voltage node;
providing a constant voltage source at the source of a diode-connected transistor;
regulating a gate voltage of the third transistor with reference to a gate voltage of the diode-connected transistor;
using a first feedback loop to regulate a gate voltage of the fourth transistor, wherein the gate voltage is regulated such that a voltage of the node of the source of the third transistor is about equal to the voltage at the source of the diode-connected transistor;
regulating a gate voltage of the fifth transistor with reference to a gate voltage of the diode-connected transistor; and
using a second feedback loop to regulate a gate voltage of the sixth transistor, wherein the gate voltage is regulated such that a voltage of the node of the source of the fifth transistor is about equal to the voltage at the source of the diode-connected transistor.

24. An apparatus comprising:
a first amplification stage having a first input, a second input, a first output and a second output, the first amplification stage comprising:
a first transistor of a first polarity, wherein the first transistor comprises an input electrically connected to the first input;
a second transistor of the first polarity, wherein the second transistor comprises an input electrically connected to the second input, and wherein the first and second transistors are configured to operate as a differential pair;
a third transistor of the first polarity, the third transistor comprising a channel disposed in a signal path between an output of the first transistor and the second output;
a fourth transistor of a second polarity opposite the first polarity, the fourth transistor comprising a channel electrically connected in parallel with the channel of the third transistor and disposed in a signal path between the output of the first transistor and the second output;
a fifth transistor of the first polarity, the fifth transistor comprising a channel disposed in a signal path between an output of the second transistor and the first output;
a sixth transistor of the second polarity, the sixth transistor comprising a channel electrically connected in parallel with the channel of the fifth transistor and disposed in a signal path between the output of the second transistor and the first output; and
a means for controlling a gate voltage of each of the third, fourth, fifth and sixth transistors.

25. The apparatus of claim 23, wherein the first polarity is n-type and the second polarity is p-type.

26. The apparatus of claim 23, wherein the controlling means comprises a current source and a bias transistor of the first type, wherein the bias transistor comprises a drain and a gate each electrically connected to the current source and to the gates of the third and fifth transistors.

27. The apparatus of claim 26, wherein the first and second transistors are field-effect transistors, and wherein the controlling means further comprises a voltage source and a first amplification block, wherein the voltage source comprises a first end electrically connected to a source of the bias transistor of the controlling means and a second end electrically connected to a source of the first transistor and to a source of the second transistor, and wherein the first amplification block comprises a first input electrically connected to the first end of the voltage source, a second input electrically connected to a drain of the first transistor, and an output configured to control the gate voltage of the fourth transistor.

28. The apparatus of claim 27, wherein the controlling means further comprises a second amplification block, the second amplification block comprising a first input electrically connected to the first end of the voltage source, a second input electrically connected to a drain of the second transistor, and an output configured to control the gate voltage of the sixth transistor.

29. The apparatus of claim 23, wherein the third and fourth transistors each have a breakdown voltage greater than a breakdown voltage of the first transistor, and wherein the fifth and sixth transistors each have a breakdown voltage greater than a breakdown voltage of the second transistor.

* * * * *